United States Patent
In et al.

(10) Patent No.: US 7,420,366 B1
(45) Date of Patent: Sep. 2, 2008

(54) COUPLED NONLINEAR SENSOR SYSTEM

(75) Inventors: Visarath In, Chula Vista, CA (US);
Antonio Palacios, San Diego, CA (US);
Yong Kho, San Diego, CA (US); Adi R. Bulsara, San Diego, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 191 days.

(21) Appl. No.: 10/874,009

(22) Filed: Jun. 18, 2004

(51) Int. Cl.
*G01R 33/04* (2006.01)
(52) U.S. Cl. .................................. 324/253; 324/244
(58) Field of Classification Search ................ 324/247,
324/253, 109, 244, 248, 254, 255, 301, 519,
324/686; 73/1.15, 1.48, 1.49, 1.51, 35.11,
73/35.13, 514.34, 514.32, 721, 727
See application file for complete search history.

(56) References Cited

U.S. PATENT DOCUMENTS 3,839,683 A * 10/1974 Edson ......................... 330/284
5,789,961 A * 8/1998 Bulsara et al. ............... 327/355
6,285,249 B1 9/2001 Bulsara et al.
6,473,362 B1 10/2002 Gabbay
6,880,400 B1 * 4/2005 Fogliatti et al. .......... 73/504.12
2004/0097803 A1 * 5/2004 Panescu ..................... 600/424

OTHER PUBLICATIONS

Visarath et al., Experimental Observation of Multifrequency Patterns in Arrays of Coupled Nonlinear Oscillators, Physical Review Letters, vol. 91, No. 24, published Dec. 11, 2003, 4 pages.*
Visarath In, et al., Coupling-induced oscillations in overdamped bistable systems, The American Physical Society, Physical Review E 68, 045102(R) (2003) pp. 045102-1 to 045102-4.
Adi R. Bulsara et al., Emergent Oscillations in Unidirectionally Coupled Overdamped Bistable Systems, dated: Feb. 12, 2004. p. 1-12.

* cited by examiner

*Primary Examiner*—Patrick Assouad
*Assistant Examiner*—David M. Schindler
(74) *Attorney, Agent, or Firm*—Kyle Eppele; Peter A. Lipovsky; J. Eric Anderson

(57) ABSTRACT

A sensor system employing a plurality of nonlinear sensors utilizes a coupling network to interconnect the sensors wherein the coupling network inherently induces oscillations in the sensor system. This approach removes the need to provide bias signal generation either onboard the sensors or via a source external to the sensor.

11 Claims, 10 Drawing Sheets

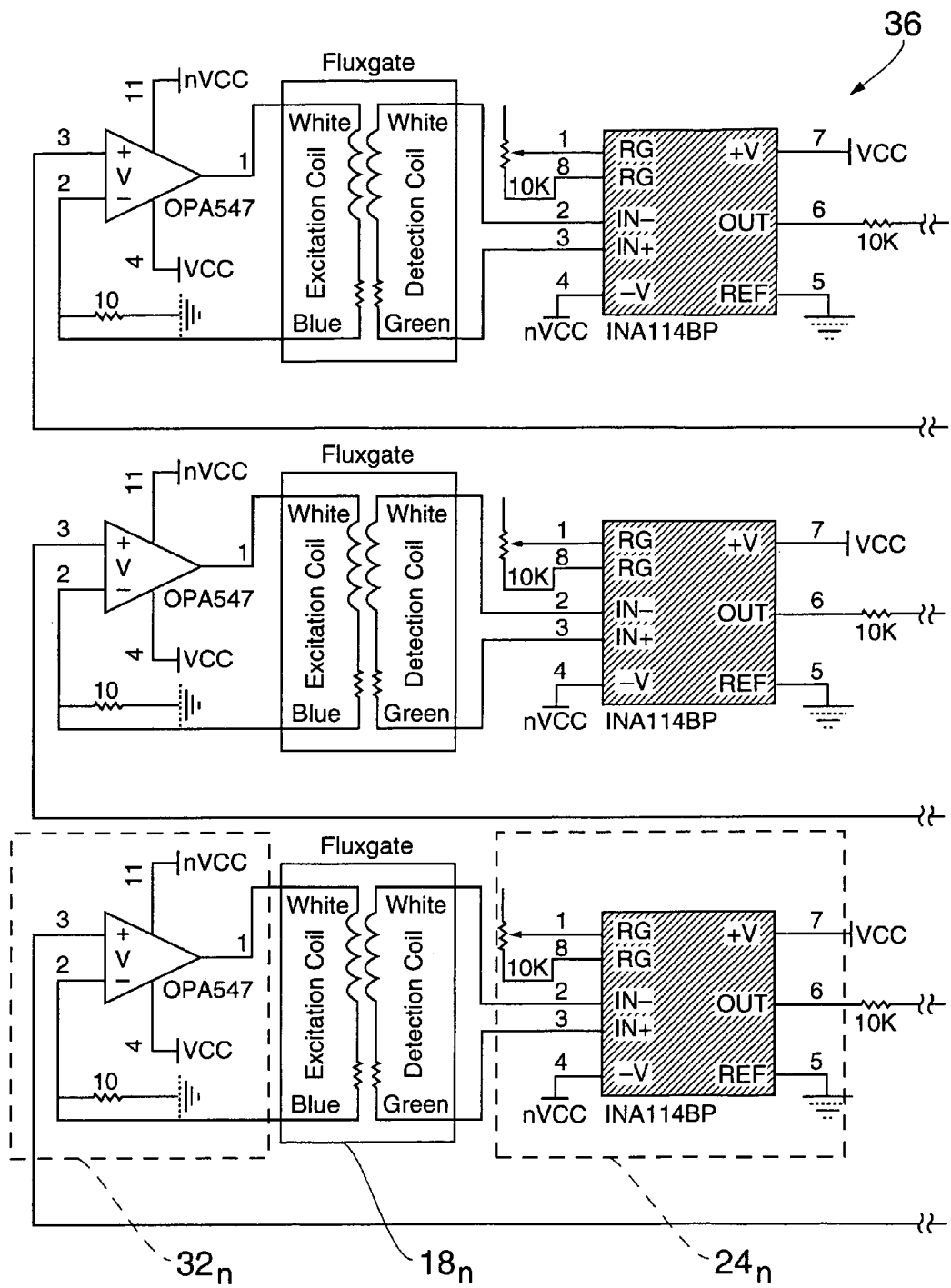
FIG. 3B1

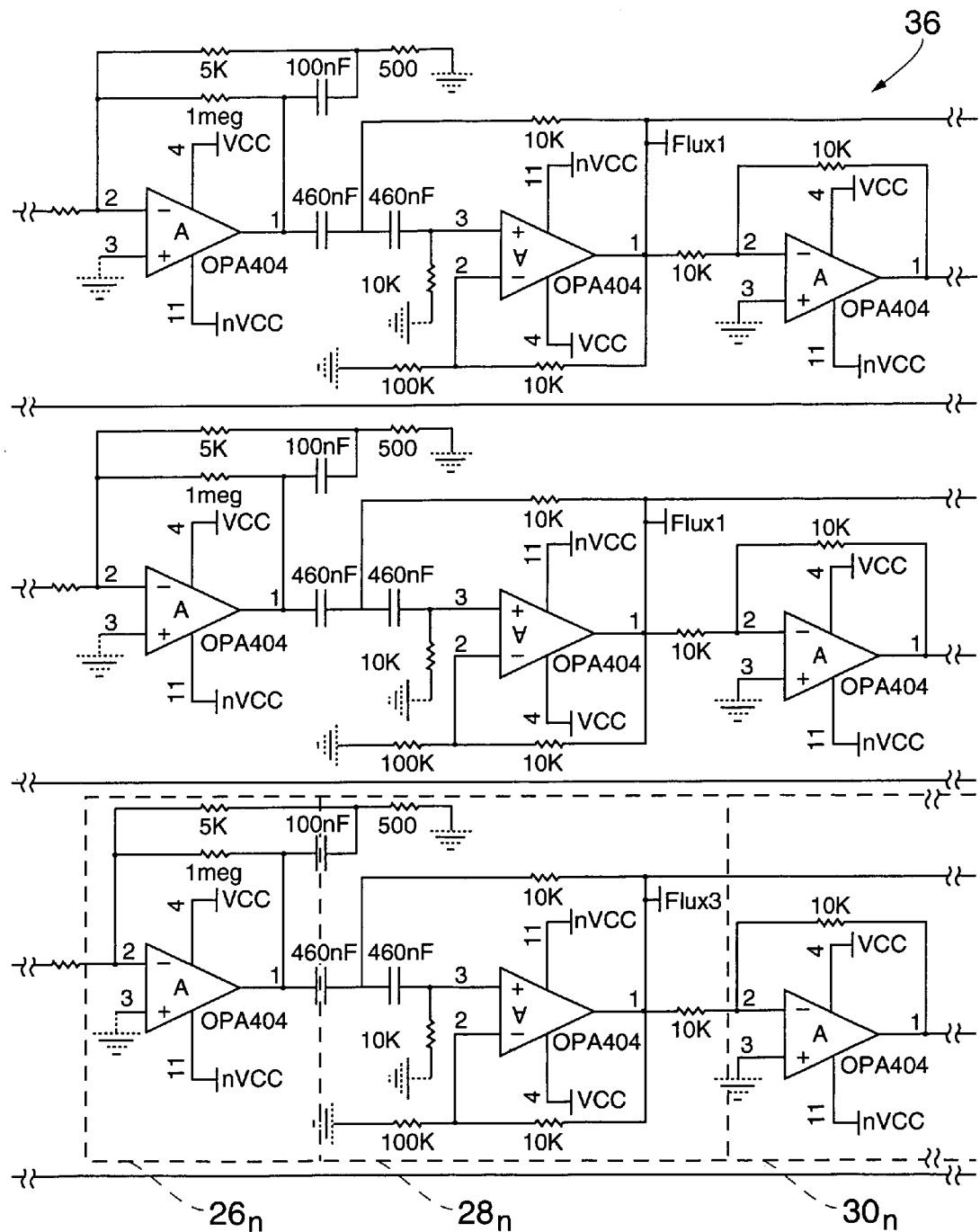
FIG. 3B2

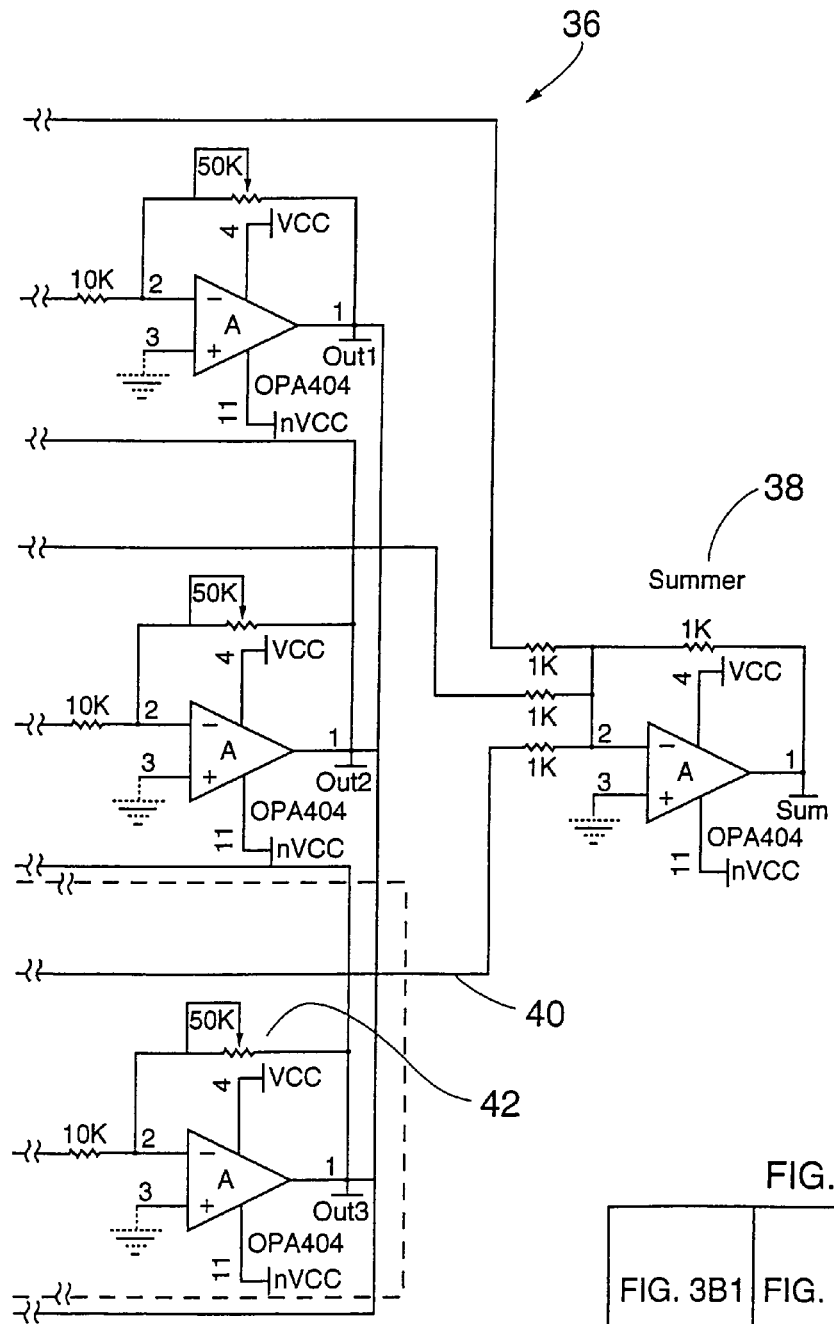
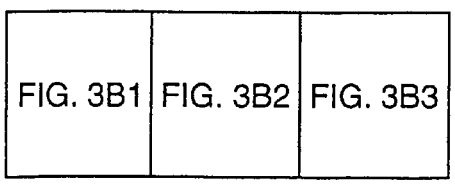
FIG. 3B3

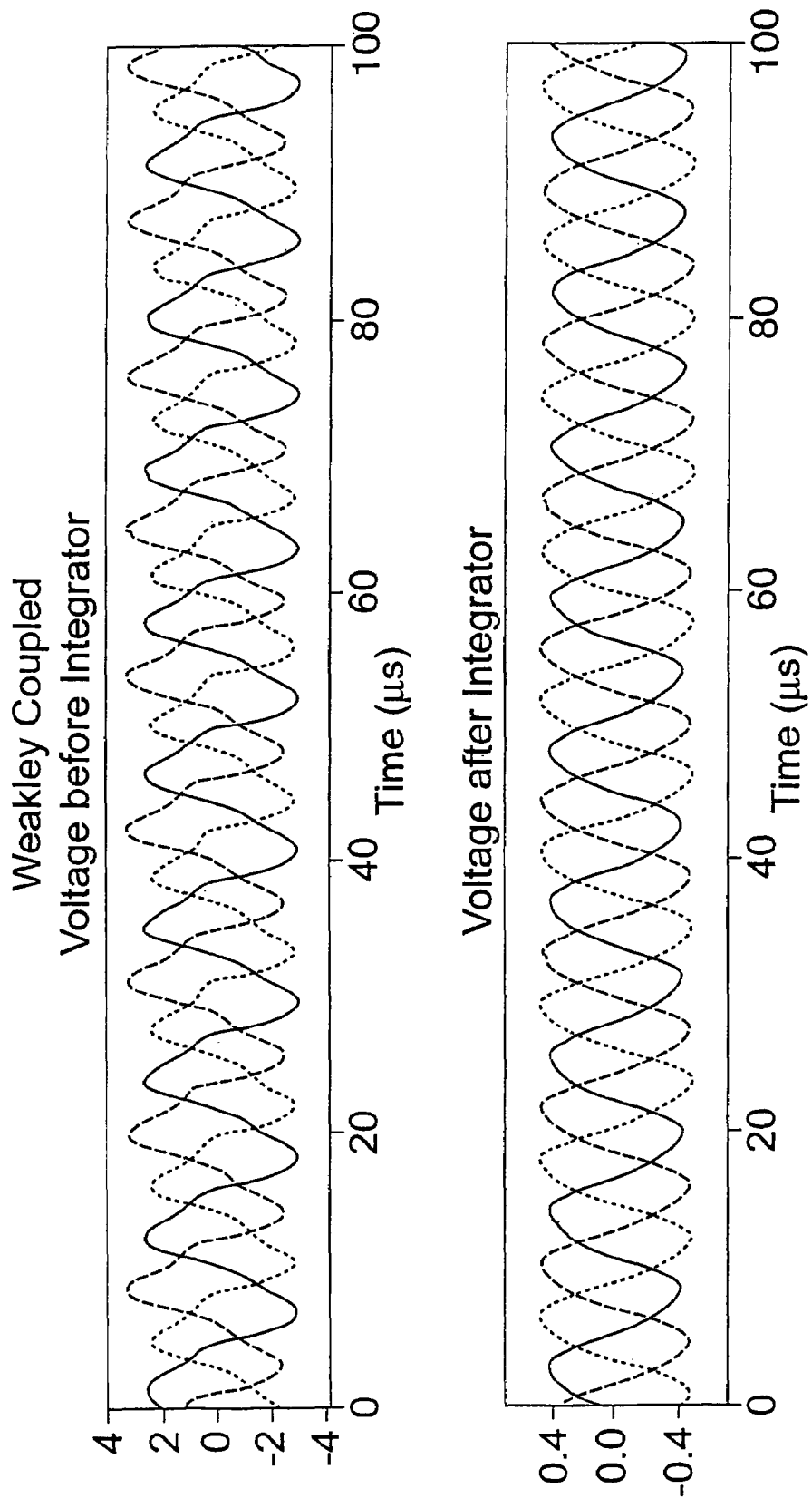
FIG. 4 Time series data collected from the actual coupled fluxgate device to demonstrate self-sustained oscillations induced via coupling.

COUPLED NONLINEAR SENSOR SYSTEM

BACKGROUND

Certain sensor systems involve nonlinear sensors that utilize a known time-periodic bias signal to excite the sensors to oscillate. A target signal is detected by noting its effect on the sensor's oscillation level-crossing statistics. These sensing techniques are accurately represented via the dynamics of overdamped bistable systems; as such, their solutions (in the absence of any driving signals or noise) are those that decay rapidly to one of the stable steady states of the detector system. Yet, for nonlinear sensors to effectively serve as detectors of target signals, the sensors need to be operated as a device that switches between its stable attractors, thereby enabling one to quantify the target signal via its effect on the sensor switching dynamics. A bias signal that promotes this switching can be provided by a signal generator onboard the sensor system, however this can increase the power budget of the sensor as well as contribute to the sensor's noise floor.

SUMMARY

A sensor system employing a plurality of nonlinear sensors utilizes a coupling network that interconnects the sensors to induce inherent oscillations in the sensor system. This approach replaces the need for bias signal generation either onboard the sensor system or via a source external to the sensor system.

Other objects, advantages and new features of the invention will become apparent from the following detailed description of the invention when considered in conjunction with the accompanied drawings.

BRIEF DESCRIPTION OF THE DRAWINGS

FIG. 3A depicts a representative sensor system in block diagram format whereas
FIGS. 3B1-3B3 illustrate a more detailed presentation of such a system.
FIG. 4 shows time series data collected from a representative sensor system.

DESCRIPTION

Figure 1:
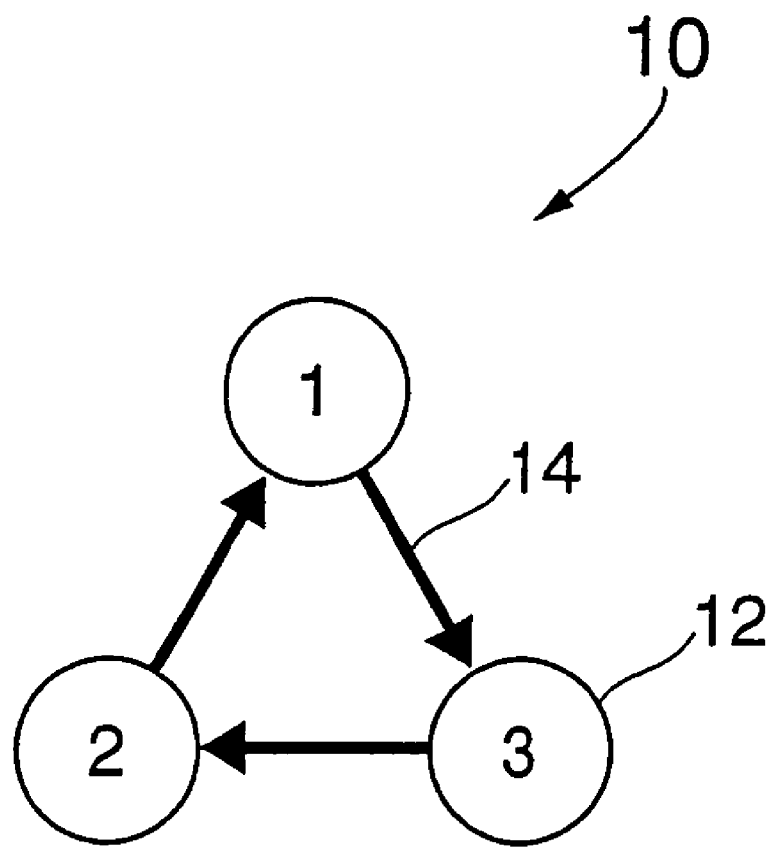
FIG. 1 is a symbolic representation of an example sensor system.

A coupling network inherently induces oscillation in coupled non-linear sensors in the absence of an external bias signal or a signal generator signal provided onboard the employed sensors. As an example, by coupling a given number of nonlinear sensors using cyclic boundary conditions and uni-directional (one-way signal flow) coupling, one can generate oscillatory solutions past a critical value of coupling coefficient. Referring now to FIG. 1, consider a sensor system 10 employing the dynamics of an odd-number, for example three, of uni-directionally coupled, nearest-neighbor fluxgate magnetometers 12, each of which are shown employed with uni-directional couplings 14 that in conjunction with each other make up a coupling network. The three nearest neighbor magnetometers in this example are shown with "nearest-neighbor" coupling. "Nearest-neighbor" and "nearest neighbor coupling" have their usual meaning in the art herein, wherein an example nearest-neighbor-coupling has a sensor $x_i$ coupled to sensors $x_{i+1}$, and $x_{i-1}$. Use of periodic boundary conditions compels the final sensor to be coupled to the first. Fluxgate magnetometer devices are considered sensitive and inexpensive detectors of magnetic signals and can be described as follows:

$$\dot{x}_1 = -x_1 + \tan h(c(x_1 + \lambda x_2 + \epsilon))$$

$$\dot{x}_2 = -x_2 + \tan h(c(x_2 + \lambda x_3 + \epsilon))$$

$$\dot{x}_3 = -x_3 + \tan h(c(x_3 + \lambda x_1 + \epsilon)) \quad (1)$$

Notice that the (unidirectional) coupling term, having strength $\lambda$, (which in this example is assumed to be equal for all three elements) is inside the nonlinearity term, a direct result of the mean-field nature of the description (in the fluxgate magnetometer, the coupling is effectuated through the induction in the driving/excitation "pick up" coil of the magnetometer). In the equations above, $x_i(t)$ represents the magnetic flux in the $i_{th}$ magnetometer using suitably normalized units, and c is a (temperature-dependent) parameter for each magnetometer element. The individual dynamics of each element are bistable for c>1. For the equations above, state variables $x_1$, $x_2$, and $x_3$ provide a way to introduce the initial conditions of the magnetometers. Finally, $\epsilon$ is a weak target signal that is provided as a magnetometer input. Typically, it is this signal that is desired to be detected.

A simple numerical integration of (1) (starting with non-identical initial conditions) reveals oscillatory behavior for $\lambda < \lambda_c$ where $\lambda_c$ is a critical threshold value of coupling strength. It will become apparent later that $\lambda_c < 0$ in the convention adopted in (1). The oscillations are non-sinusoidal, with a frequency that increases as the coupling strength decreases away from $\lambda_c$. For $\lambda > \lambda_c$, however, the system quickly settles into a steady state that depends on the initial conditions. In experimentation, randomization of the initial conditions was found to easily occur due to inherent noise in the sensor system. Even a slight variation in the initial conditions, away from $x_1 = x_2 = x_3$, will push the system into the oscillatory solution. For practical purposes, operational constraints (e.g. a noise-floor) will compel non-equal initial conditions.

For the system described by Eq. (1), we may use the underlying nonlinear dynamics to obtain the critical coupling strength parameter $\lambda_c$ (for the onset of oscillations) as well as the oscillation frequency $\omega$, in terms of the system and target signal parameters:

$$\lambda_c = -\varepsilon + \frac{1}{c}\ln(\sqrt{c} + \sqrt{c-1}) - \tanh(\ln(\sqrt{c} + \sqrt{c-1})) \quad (2)$$

$$\omega \approx \frac{1}{3[c(c-1)]^{1/4}}\left[\frac{1}{\sqrt{\lambda_c - \lambda}} + \frac{1}{\sqrt{\lambda_c - \lambda + 2\varepsilon}}\right]^{-1} \quad (3)$$

Figure 2:
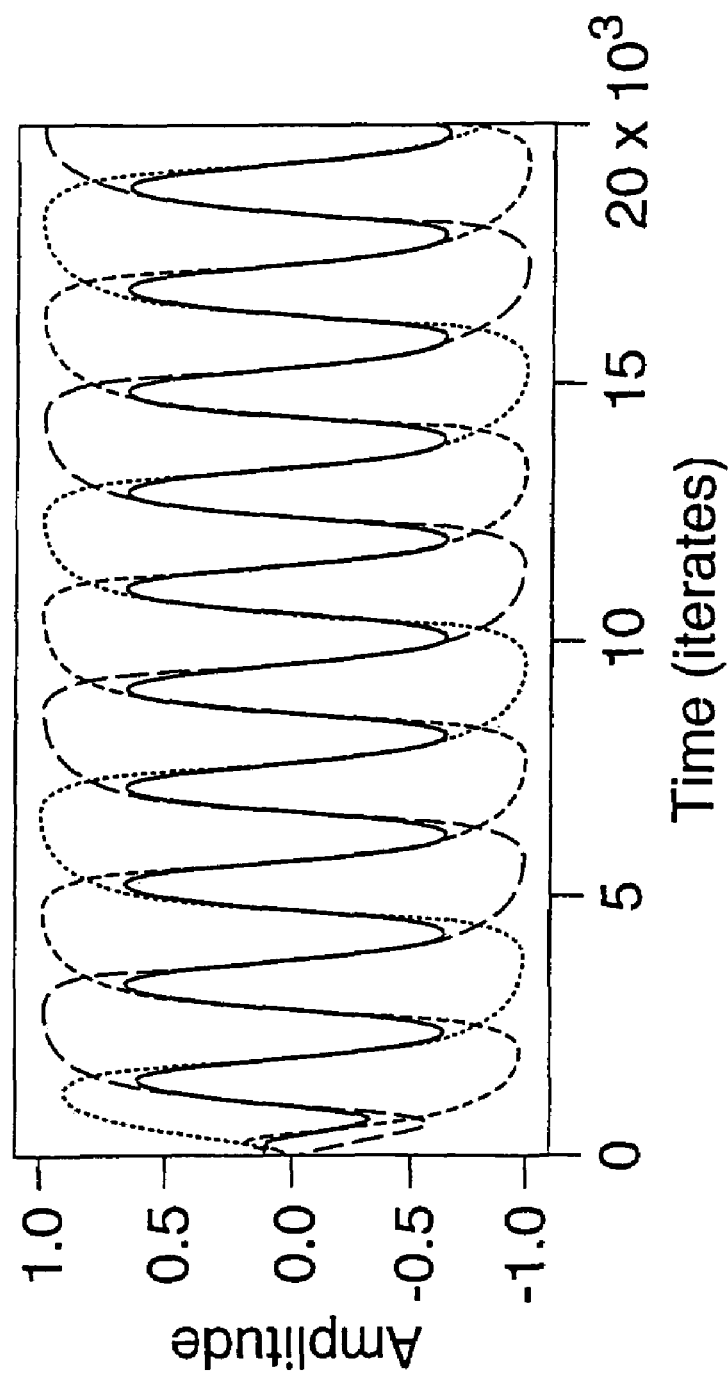
FIG. 2 shows a time series plot of sensor waveforms.

The summed oscillations are not sinusoidal. However, they tend to be sinusoidal for large coupling strength magnitude ($\lambda \ll \lambda_c$; recall that $\lambda_c < 0$). It is instructive to note that there is a precise $2\pi/3$ phase difference between solutions, see FIG. 2 (for N coupled nonlinear sensors, this phase offset will be $2\pi/N$. Further, the summed output of the sensor system is almost perfectly sinusoidal, having frequency $3\omega$ (N$\omega$ in general). In FIG. 2, there is shown a time series plot of individual waveforms $x_1(t)$, $x_2(t)$ and $x_3(t)$ (in light lines) and their sum (dark line) for c=3, $\lambda$=0.650 and $\epsilon$=0.

Numerical simulations and calculations with (3) show that $\omega$ is very sensitive to small changes in the target signal strength $\epsilon$; in addition, the mean value of the oscillation amplitude is non-zero for finite $\epsilon$. Both of these effects can be used to quantify a very weak "target" signal $\epsilon$. A very small power source should suffice to sustain the oscillations once the sensor system initially oscillates.

The summed response $X(t)$ of the sensors has been observed to be particularly sensitive to the presence of a target signal. Numerical simulations show that the mean amplitude of $X(t)$ can be an order of magnitude or more in excess of the corresponding response of a single uncoupled sensor that is externally driven to generate oscillations similar to those shown in FIG. 2. Hence, the inherent oscillation scheme described herein affords the possibility of low sensor system power requirements and high sensitivity.

In the presence of a noise-floor in each nonlinear sensor, one would expect not to observe a significant change (introduced solely by the noise) in the frequency $\omega$, as long as the noise strength is much smaller than the energy barrier height in the absence of coupling, noting that the generated oscillations are suprathreshold. The noise-floor also provides needed non-identical initial conditions in the elements of the array.

The target signal may be quantified, for example, via the change in oscillation frequency of the sensor system as well as through a computation of the mean values $<x_i(t)>$ or $<X(t)>$, or even through spectral or level-crossing techniques.

Figure 3A:
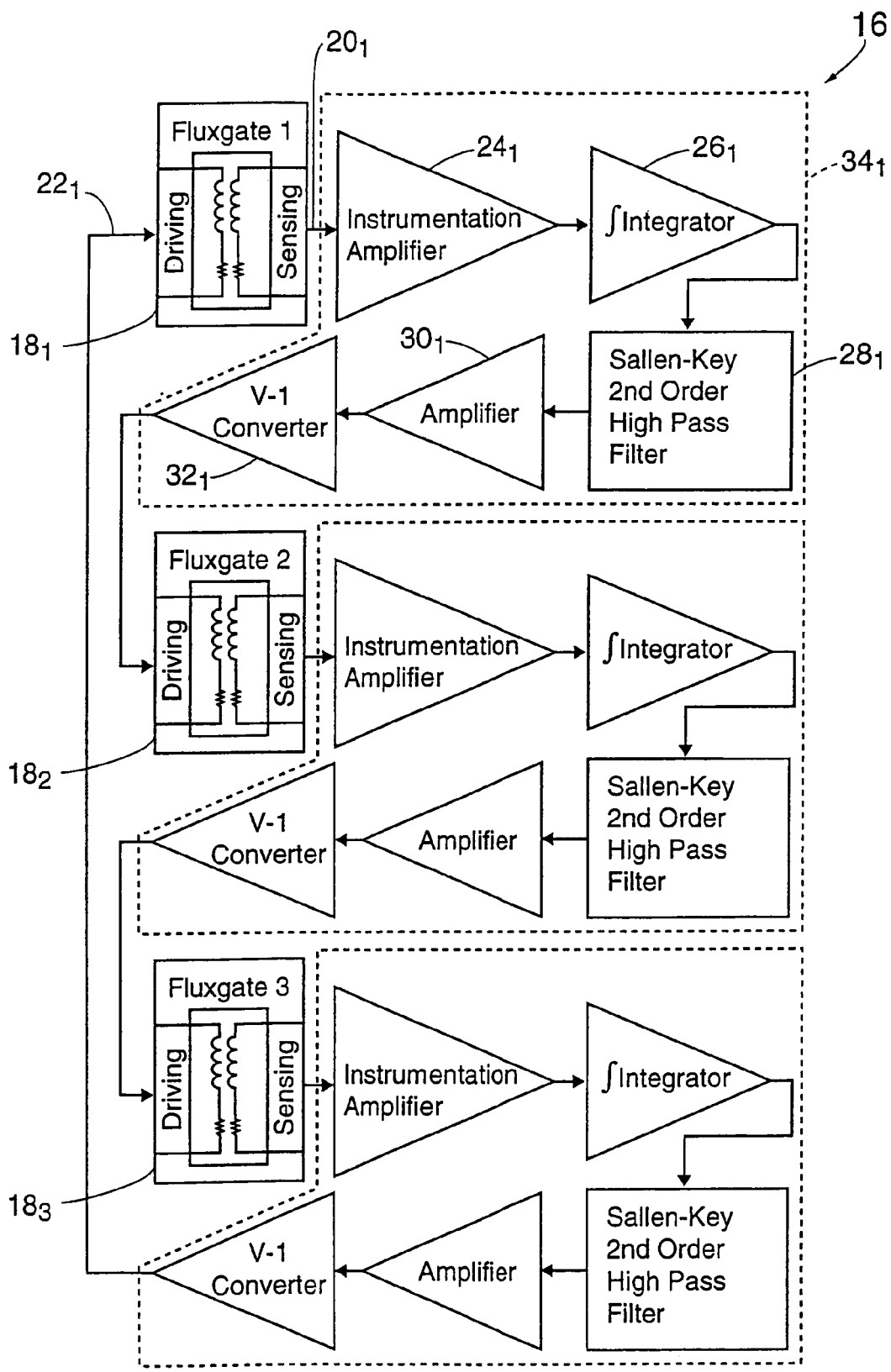

FIG. 3A shows a block diagram format sensor setup using three Printed-Circuit-Board (PCB)—technology based fluxgate magnetometers, for example. The output of the fluxgates may be taken directly as the magnetic flux response, or a voltage obtained by differentiating the flux response with respect to time (see FIG. 4). Experiments show that the flux response is more sensitive, which is in excellent agreement with the numerical simulation results. In addition, it has been observed that by carefully tuning the coupling strength so that the system is poised just beyond the oscillation threshold (i.e. the oscillation frequency is low), significantly greater sensitivity can be achieved, see FIGS. 5A-5B. Further description will be provided herein as to an example way in which this coupling strength can be adjusted.

Figure 5A:
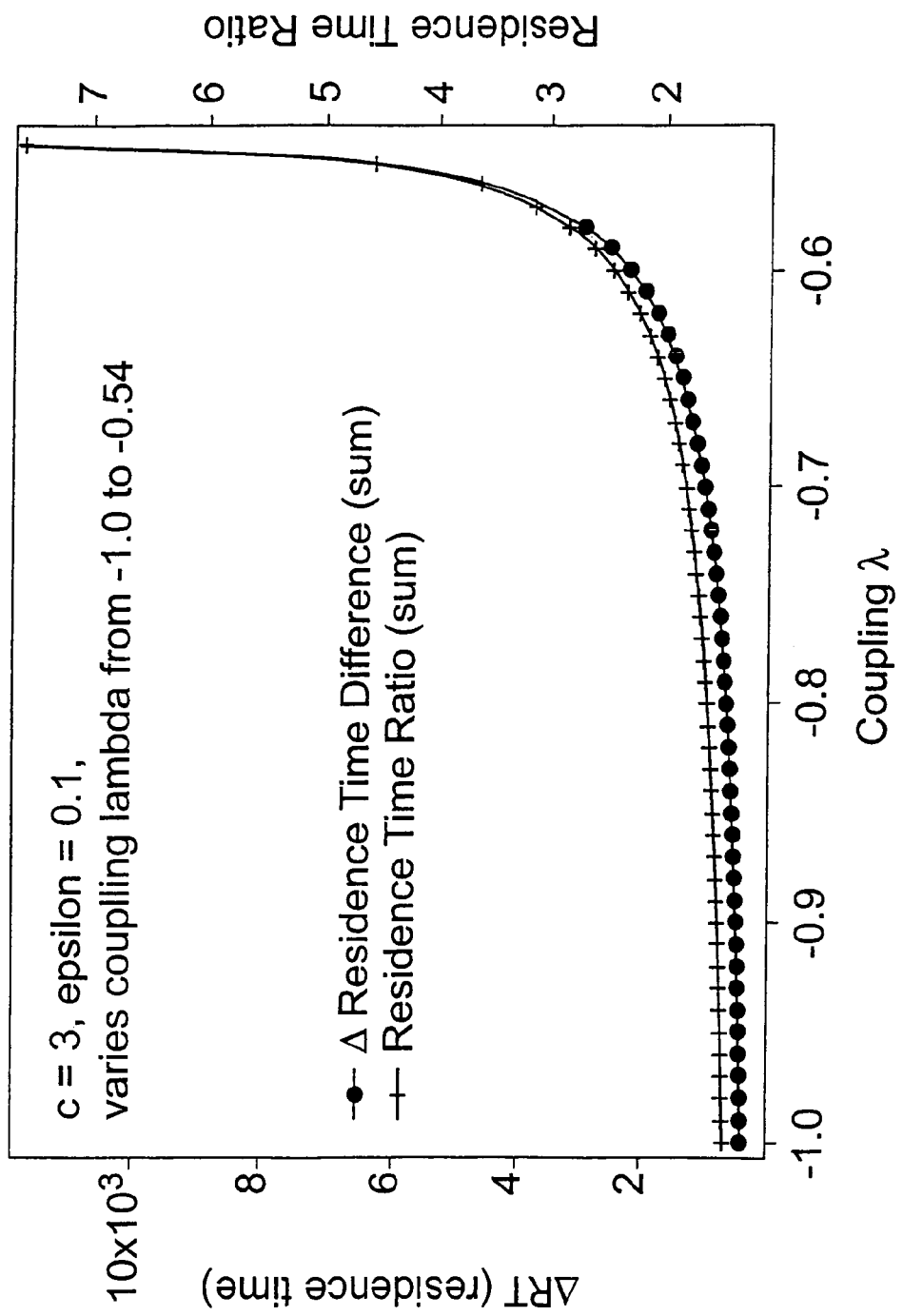
FIGS. 5A and B depict residence time data.
Figure 5B:
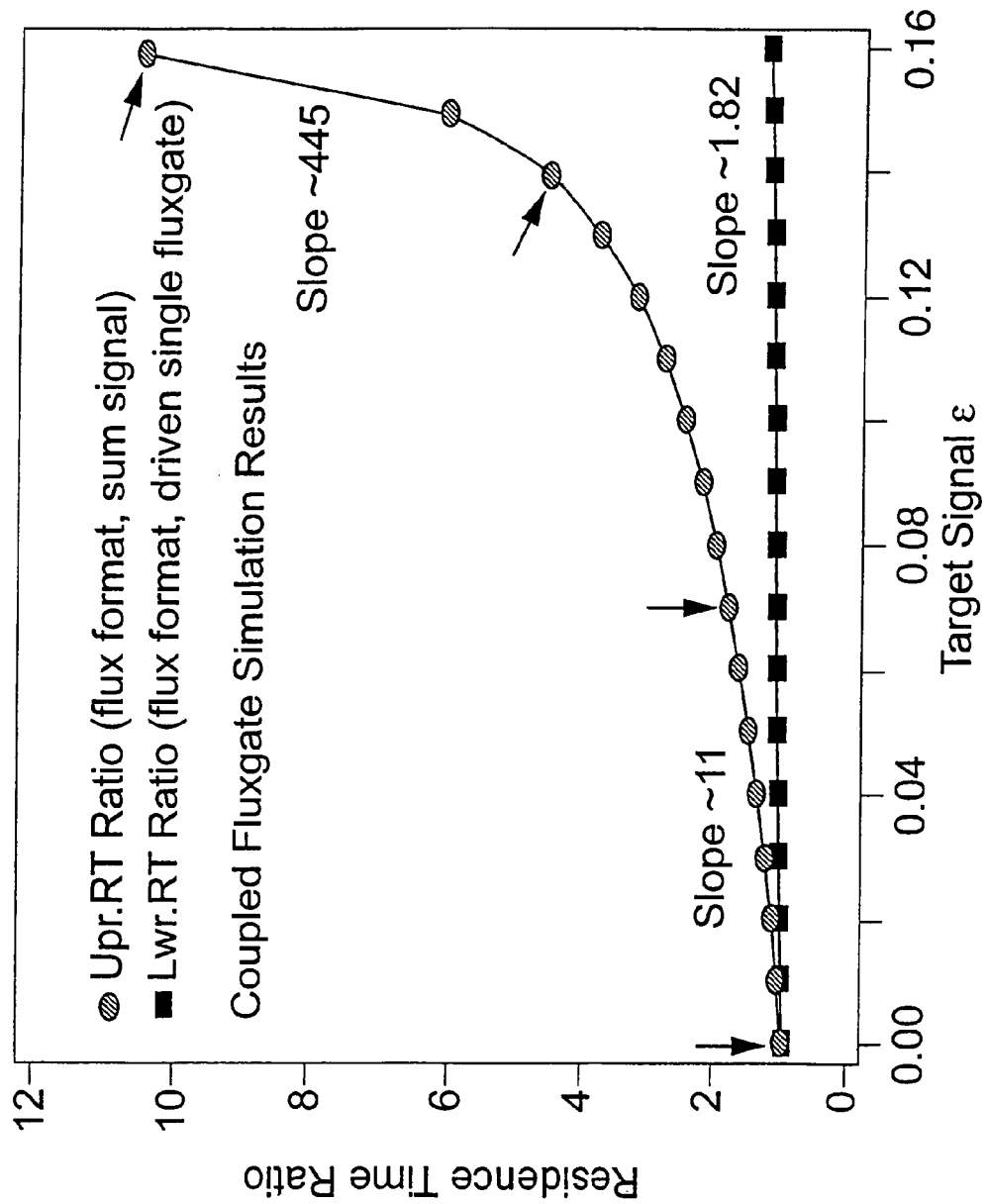

FIG. 5A shows a plot of the residence time difference (left axis) between upper and lower oscillating states versus coupling strength. It also shows a plot of the residence time ratio between the upper and lower oscillating states versus coupling strength. Either method can be used to detect the target signal. The slope of the curve represents the sensitivity of the device to detect a target signal. This plot is produced with the target signal strength at $\epsilon=0.1$, and $\lambda$ varies from $-1.0$ to $-0.54$ which is near the bifurcation point (onset of oscillation) for the particular value of $\epsilon=0.1$. Sensitivity in this case is taken to be proportional to the mean difference in residence times in the stable states of a 2-threshold system, to which the summed output is applied. FIG. 5B shows the marked enhanced sensitivity achievable by coupled sensors (upper graph) versus that of a single sensor (lower graph). The slope of the curve is defined as the sensitivity of the response, wherein a constant slope reflects a constant sensitivity. Near the onset of bifurcation, the slope rises nearly vertically indicating a great sensitivity in that region.

Turning now to further details of FIG. 3A, an example sensor system 16 involves three coupled fluxgate magnetometers $18_n$ wherein n in this example is three. Magnetometers $18_n$ each have an output $20_n$ and input $22_n$. As can be seen, output $20_1$ of magnetometer $18_1$ is coupled to provide a corresponding input to magnetometer $18_2$ by way of coupling elements $24_1$, $26_1$, $28_1$, $30_1$ and $32_1$ collectively making up a coupling circuit $34_1$ and similarly for each of the magnetometers wherein the combined coupling elements and their interconnections with the magnetometers make up a coupling network that as described herein generates an inherent oscillation in system 16. Example PCB technology based fluxgates are made of Cobalt-based trademark Metglas 2714A material as their cores and each is sandwiched between two sheets of PCB material. The sides of the PCB sheets that face away from the core material are printed with copper wirings to form the windings for the driving coil and the sensing coil. Solder is used to fuse the two sheets together to complete the circuit for the windings. These are of course example fluxgates and it will be realized by those versed in the nonlinear sensor art that other fluxgates as well as different nonlinear sensors may be employed according to the description herein.

As can be seen, fluxgates $18_n$ are coupled through electronic circuits $34_n$ where the (voltage) readout of one fluxgate signal $20_n$ (i.e. the derivative signal of the flux detected by the sensing coil of the fluxgate device) is amplified by differential voltage amplifier $24_n$ (such as an instrumentation amplifier with a very high impedance). At this point, the amplifier may be used to trim out any d.c. in the fluxgate output. Following this, the signal is passed through an integrator $26_n$ to convert the derivative signal seen by the sensing coil back to a "flux" form to conform this system closely to the model of equation (1). The use of a "leaky" integrator at this stage helps to minimize divergence caused by any small d.c. signal that might have leaked through the voltage amplifier stage. Typically, the output of the integrator is also accompanied by d.c. that is removed before the signal is passed to the other fluxgates. This is accomplished by employing a filter $28_n$ such as a Sallen-Key second-order high pass filter. This filter is placed immediately after the integrator, with the filter parameters tuned to work at a specific frequency (the mean oscillating frequency of the coupled system). The signal then passes through amplifier $30_n$ to achieve adequate gain to drive the downstream adjacent fluxgate. After this amplification stage, the signal passes through voltage-to-current converter (V-I converter) $32_n$ in its final step to drive the primary (driving) coil of the next-in-line fluxgate. This converter also has a gain factor but it is set at a fixed value during the construction of the coupling circuits. The gain is set at much less than unity so that one volt in the signal does not convert to one ampere in the voltage-to-current converter stage.

As can be seen, the setup repeats for the other two coupling circuits for the remaining fluxgates and all values of the coupling circuit parameters are closely matched from one set to the other. Each stage of the coupling circuit also can be used with high speed and high precision operational amplifiers to further minimize time delay and to more closely conform the circuits to the model of equation (1) as knowledge of state variable $x_i$ is known in the model.

Referring now to FIGS. 3A-3C, a greater detailed embodiment of the set-up of FIG. 3A is shown. Sensor system 36 of this figure incorporates a summer 38 for summing a coupling circuit output (in this example, the magnetic flux) corresponding to each of the n nonlinear sensors of the system. In this figure, schematic-level description is provided for V-I converters $32_n$, fluxgate sensors $18_n$, instrumentation amplifiers $24_n$, integrators $26_n$, filters $28_n$, and amplifiers $30_n$. As can be seen in this figure, a coupling circuit output 40 is tapped from each of the coupling circuits and these are summed in summer 38 of this figure. While the coupling circuit output is shown to be taken after integrator $26_n$, system performance can also be assessed by tapping the coupling circuit before the integrator.

The phenomena described herein can be extended to a wide class of nonlinear dynamic sensor systems. For example, a system of coupled overdamped Duffing sensing elements described via quartic potentials:

$$\dot{x}_1(t) = ax_1 - bx_1^3 + \lambda(x_1 - x_2)$$

$$\dot{x}_2(t) = ax_2 - bx_2^3 + \lambda(x_2 - x_3)$$

$$\dot{x}_3(t) = ax_3 - bx_3^3 + \lambda(x_3 - x_1) \quad (4)$$

The bifurcation mechanism leading to oscillations for this sensor system is different from the fluxgate array described above; nonetheless, the same qualitative features appear in the overall response of the system. It has been observed that the oscillatory behavior in the sensor system does not occur in a single unforced sensor. Even when coupled, the number of elements, initial conditions, and the type of coupling, all contribute to the emergence of this behavior. Hence, the disclosure herein provides new considerations in enhancing the utility and sensitivity of a large class of nonlinear dynamic sensors, such as fluxgate magnetometers for magnetic fields, ferroelectric detectors for electric-fields, or piezo-electric detectors for acoustics applications.

System resolution (defined as the mean residence times difference in the stable states of a threshold detector into which the summed output of the sensor system is fed) can be enhanced by carefully tuning the array (via the system parameter $\lambda$) to just beyond the onset of the oscillations. This works particularly well, when one has a reasonable a priori knowledge of the target signal values involved in a particular application, or when the target signal can be suitably gated (limited) to avoid saturating the system. Referring to FIG. 3A, the coupling strength $\lambda$ may be adjusted by altering the values of the resistors and capacitors used in the coupling circuits 34. In the specific implementation described in FIGS. 3A-3C by way of example, variable resistor 42 of amplifier element 30 permits easy adjustment of $\lambda$.

As discussed, a variety of mechanisms is available to quantify a target signal when using the sensor system described herein. The target signal may be quantified via its effect on the frequency of the induced system oscillations, as well as the shift in the mean value of this frequency. The residence time readout method can also be used to discern the target signal. As those skilled in the art will realize, the circuitries required for these detection methods are quite simple; in particular, no feedback circuit is required.

Figure 6:
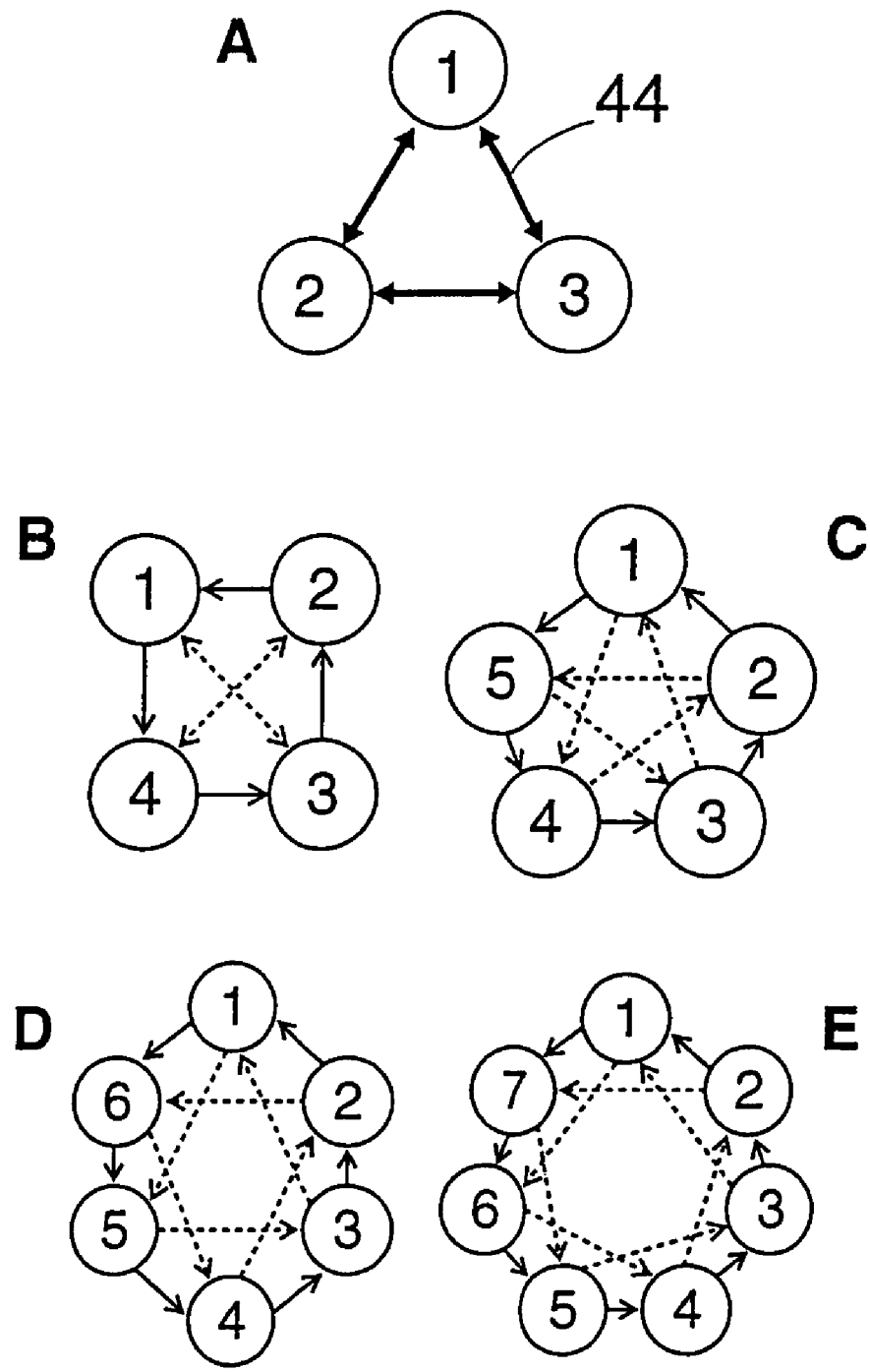
FIGS. 6A-6E are symbolic representations of additional example sensor systems.

Though in FIG. 1, sensing system 10 was described utilizing one-way couplings 14 between nearest neighbor sensing elements 12, the sensing system can employ a variety of other coupling/sensor configurations. For example in FIGS. 6, a number of representative configurations are presented. In FIG. 6A, there is shown bidirectional coupling 44 between nearest-neighbor sensors. FIG. 6B illustrates unidirectional (one-way) coupling for nearest neighbor sensors combined with bidirectional (two-way) coupling between non-nearest neighbor sensors. FIGS. 6C-E show unidirectional (one-way) coupling between nearest neighbor sensors combined with unidirectional (one-way) sensor coupling between every other non-nearest neighbor. In all of the coupling/sensor configurations described, the term "nearest neighbor" sensor takes on its conventional meaning in the art.

Obviously, many modifications and variations of the invention are possible in light of the above description. It is therefore to be understood that within the scope of the appended claims, the invention may be practiced otherwise than as has been specifically described.

What is claimed is:

1. An apparatus comprising:
   an odd number of at least three nonlinear sensors each having an input and an output; and
   a coupling network configured to inherently induce oscillation in said nonlinear sensors in the absence of an external bias signal, said coupling network including a coupling circuit individual to each of said nonlinear sensors, said coupling network unidirectionally coupling said nonlinear sensors so that each said nonlinear sensor has its said output coupled via its coupling circuit to said input of only one other said nonlinear sensor wherein said coupling circuits are configured to allow only one-way signal flow between said sensors that are nearest-neighbor sensors.

2. The apparatus of claim 1 further including a summer connected to each said coupling circuit individual to each of said nonlinear sensors to sum a coupling circuit output from each of said nonlinear sensors.

3. The apparatus of claim 2 wherein each of said nonlinear sensors is one-dimensional.

4. The apparatus of claim 1 wherein each of said nonlinear sensors is a magnetic fluxgate.

5. The apparatus of claim 4 wherein said one-way signal flow between said sensors follows a circuitous path in said coupling network.

6. The apparatus of claim 1 wherein said nonlinear sensors are chosen from the group of magnetic sensors, ferro-electric sensors, and piezo-electric sensors.

7. An apparatus comprising:
   an odd number of at least three nonlinear sensors each having an input and an output;
   a coupling network configured to inherently induce oscillation in said nonlinear sensors in the absence of an external bias signal, said coupling network including a coupling circuit individual to each of said nonlinear sensors, said coupling network unidirectionally coupling said nonlinear sensors so that each said nonlinear sensor has its said output coupled via its said coupling circuit to said input of only one other said nonlinear sensor, said coupling network providing one-way signal flow between said sensors that are nearest-neighbor sensors; and
   a summer connected to each said coupling circuit individual to each of said nonlinear sensors to sum a coupling circuit output from each of said nonlinear sensors.

8. The apparatus of claim 7 wherein each of said nonlinear sensors is a magnetic fluxgate.

9. The apparatus of claim 7 wherein said one-way signal flow between said sensors follows a circuitous path in said coupling network.

10. The apparatus of claim 7 wherein said nonlinear sensors are chosen from the group of magnetic sensors, ferro-electric sensors, and piezo-electric sensors.

11. An apparatus comprising:
    three magnetic fluxgate sensors each having an input and an output;
    a coupling network configured to inherently induce oscillation in said magnetic fluxgate sensors in the absence of an external bias signal, said coupling network including a coupling circuit individual to each of said magnetic fluxgate sensors, said coupling network unidirectionally coupling said magnetic fluxgate sensors so that each said magnetic fluxgate sensor has its said output coupled via its said coupling circuit individual to each of said magnetic fluxgate sensors to said input of only one other said magnetic fluxgate sensor, said coupling network providing one-way signal flow between said magnetic fluxgate sensors that are nearest-neighbor magnetic fluxgate sensors, wherein said one-way signal flow between said magnetic fluxgate sensors follows a circuitous path in said coupling network; and a summer connected to each of said coupling circuits individual to each of said magnetic fluxgate sensors to sum a coupling circuit output from each of said magnetic fluxgate sensors.

* * * * *